United States Patent
Boskaljon et al.

(10) Patent No.: US 10,103,420 B2
(45) Date of Patent: Oct. 16, 2018

(54) CABLE TAP

(71) Applicant: Technetix B.V., Veenendaal (NL)

(72) Inventors: Gerrit Boskaljon, Veenendaal (NL);
Martien Rijssemus, Veenendaal (NL)

(73) Assignee: Technetix B.V., Veenendaal (NL)

( * ) Notice: Subject to any disclaimer, the term of this patent is extended or adjusted under 35 U.S.C. 154(b) by 31 days.

(21) Appl. No.: 15/326,047

(22) PCT Filed: Jun. 11, 2015

(86) PCT No.: PCT/EP2015/063098
§ 371 (c)(1),
(2) Date: Jan. 13, 2017

(87) PCT Pub. No.: WO2016/008658
PCT Pub. Date: Jan. 21, 2016

(65) Prior Publication Data
US 2017/0201001 A1   Jul. 13, 2017

(30) Foreign Application Priority Data

Jul. 16, 2014   (GB) .................................. 1412587.6

(51) Int. Cl.
*H01P 5/18* (2006.01)
*H03H 7/48* (2006.01)
(Continued)

(52) U.S. Cl.
CPC .............. *H01P 5/184* (2013.01); *H03H 7/48* (2013.01); *H04B 3/02* (2013.01); *H04N 7/104* (2013.01)

(58) Field of Classification Search
CPC ............... H01P 5/18; H03H 7/48; H04N 7/10
(Continued)

(56) References Cited

U.S. PATENT DOCUMENTS

| 3,559,110 A | 1/1971 | Wiley et al. |
| 4,222,066 A | 9/1980 | Zelenz |

(Continued)

FOREIGN PATENT DOCUMENTS

| CN | 201048432 Y | 4/2008 |
| CN | 201104360 Y | 8/2008 |

(Continued)

OTHER PUBLICATIONS

European Patent Office, International Search Report and Written Opinion of the International Searching Authority, International Application No. PCT/EP2015/063098, dated Sep. 28, 2015 (10 pages).

(Continued)

*Primary Examiner* — Dean Takaoka
(74) *Attorney, Agent, or Firm* — Wood Herron & Evans LLP

(57) ABSTRACT

There is provided a cable tap device for a CATV network comprising a microstrip directional coupler on an electrical path between an input and an output and arranged to communicate with a splitter device associated with a plurality of tap ports. A tilt compensating circuit is disposed between the microstrip directional coupler and the splitter device. A feedback path comprising resistive, inductive and capacitive elements connects an isolated port of the microstrip directional coupler to that part of the electrical path between the input and the input port of the microstrip directional coupler.

6 Claims, 2 Drawing Sheets

(51) Int. Cl.
*H04N 7/10* (2006.01)
*H04B 3/02* (2006.01)

(58) Field of Classification Search
USPC .................................................. 333/109, 112
See application file for complete search history.

(56) References Cited

U.S. PATENT DOCUMENTS

| | | | |
|---|---|---|---|
| 4,646,295 A | 2/1987 | Basile | |
| 4,963,966 A * | 10/1990 | Harney | H04N 7/104 |
| | | | 348/E7.053 |
| 5,058,198 A * | 10/1991 | Rocci | H03H 7/482 |
| | | | 333/109 |
| 5,485,630 A * | 1/1996 | Lee | H04H 20/78 |
| | | | 348/E7.049 |
| H001858 H | 9/2000 | Ibelings | |
| 6,114,924 A | 9/2000 | Cain et al. | |
| H001879 H | 10/2000 | Spriester et al. | |
| 6,560,778 B1 | 5/2003 | Hasegawa | |
| 6,570,465 B2 * | 5/2003 | Tang | H01R 24/547 |
| | | | 333/109 |
| 7,394,333 B2 | 7/2008 | Ezzeddine et al. | |
| 8,587,387 B2 | 11/2013 | Lee | |
| 8,810,334 B2 | 8/2014 | Rijssemus | |
| 2002/0100060 A1 | 7/2002 | Sugiura | |
| 2003/0093811 A1 | 5/2003 | Kaufman | |
| 2013/0061276 A1 | 3/2013 | Urban | |
| 2017/0155182 A1 | 6/2017 | Rijssemus et al. | |
| 2017/0201001 A1 | 7/2017 | Boskaljon et al. | |
| 2017/0264938 A1 * | 9/2017 | Rijssemus | H04N 21/426 |

FOREIGN PATENT DOCUMENTS

| | | |
|---|---|---|
| EP | 0821527 A2 | 1/1998 |
| WO | 03049225 A1 | 6/2003 |

OTHER PUBLICATIONS

Espacenet, English Machine Translation of Abstract for CN201048432Y, dated Apr. 16, 2008, retrieved from https://worldwide.espacenet.com on Nov. 1, 2016 (1 page).

Intellectual Property Office of the United Kingdom, Patents Act 1977: Search Report under Section 17, Application No. GB1604631.0, dated Sep. 7, 2016 (2 pages).

* cited by examiner

CABLE TAP

CROSS-REFERENCE TO RELATED APPLICATIONS

This application is a submission under 35 U.S.C. § 371 of International Application No. PCT/EP2015/063098, filed Jun. 11, 2015, which claims priority to United Kingdom Application No. 1412587.6, filed Jul. 16, 2014, the disclosures of which are hereby expressly incorporated by reference herein in their entireties.

FIELD OF THE INVENTION

The present invention relates to a cable tap for a cable network, and, in particular, to an outdoor tap.

BACKGROUND OF THE INVENTION

Many cable networks are built in a cascaded (tree and branch) structure. This means that several amplifiers and taps are all placed in series with branches tapping off some of the signal and feeding again a cascade of amplifiers and taps. These branches can be tapped off to feed another cascade of taps. Since taps are placed in series and therefore have different input signal levels caused by attenuation in the coaxial cable and in the taps itself, different models of taps with different tap loss values are used. Usually, the first taps have a high input signal level and therefore need to have a high attenuation from input to tap output port, known as tap loss, and automatically a low insertion loss from the input to the output. When migrating down the line, the tap loss needs to be lower as there is less energy because of loss in the former taps and in the coaxial cable and the insertion loss becomes automatically higher as more energy is tapped off from the line.

These taps are known in the industry as "outdoor taps" as such a network is typically not mounted in cabinets but on overhead strands or poles or on the walls of houses. In such a network, a small deviation from the ideal frequency response from in to out (so called ripple) in the outdoor taps is amplified by the total number of outdoor taps placed in series. This means that, for example, a small and seemingly unimportant ripple in the frequency response of 0.2 dB in a single outdoor tap is multiplied to a more significant 2 dB when 10 outdoor taps are cascaded. Since the outdoor taps usually have a more or less equal frequency response, this is a real problem.

The same is true for the insertion loss from in to out. If the insertion loss can be lowered with only as little as 0.1 dB this means that at the end of the coaxial line the level of insertion loss will be 0.1 dB×the number of cascaded outdoor taps higher. This is of great importance as many networks need to be stretched to higher frequencies to transport more and more data and programs. Higher frequencies mean significantly more loss in the coaxial cables and thus lower levels at the end of the line. Re-spacing or adding of amplifiers placed in the cascaded network is usually not possible or only at very high costs. A lower loss in the outdoor taps therefore is a real advantage.

SUMMARY OF THE INVENTION

In accordance with the present invention, there is provided a cable tap device for use in a cable television (CATV) network, the cable tap device comprising a directional coupler disposed on a through electrical path between an input and an output, the directional coupler arranged to communicate with a splitter device associated with a plurality of tap ports, wherein the directional coupler is a microstrip directional coupler. By using a microstrip directional coupler, the requirement for a power choke or large inductor to divert AC and DC current around the directional coupler is avoided.

Preferably, a coupling port of the microstrip directional coupler is in communication with the splitter device.

Desirably, a tilt compensating means or circuit may be disposed between the microstrip directional coupler and the splitter device to precisely adapt the tap loss to counteract losses in coaxial cables when the tap device is positioned within a network.

Preferably, an isolated port of the microstrip directional coupler is connected to the input port of the microstrip directional coupler by a feedback path comprising resistive, inductive and capacitive elements so as to control frequency response. Within this feedback path, at least one capacitive element is provided to ensure AC and/or DC voltage cannot migrate into the tap outputs. The resistive and inductive elements actively modify the frequency response at low frequencies.

Preferably, the inductive elements will comprise a 180° transformer connected to an inductor. Within the feedback path, a preferred arrangement is for the resistive element to be disposed between the isolated port and transformer, with the inductor and capacitor disposed between the transformer and that part of the electrical path running between the input and input port of the microstrip directional coupler.

BRIEF DESCRIPTION OF THE DRAWINGS

The present invention will now be described by way of example with reference to the following drawings in which.

DETAILED DESCRIPTION OF THE INVENTION

Figure 1:
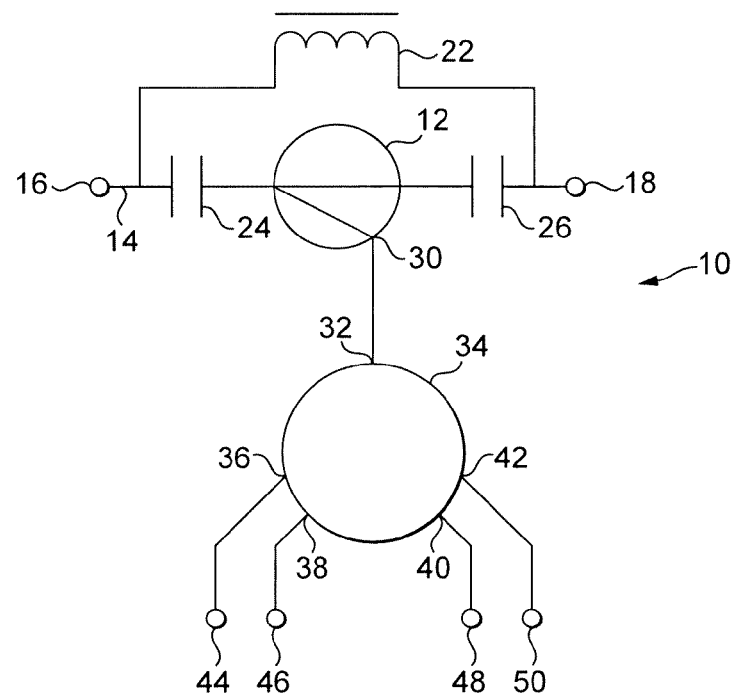
FIG. 1 shows a schematic diagram of a prior art outdoor tap.

FIG. 1 shown an outdoor tap 10 as used in existing broadband cable television (CATV) networks. A plurality of interconnected taps are positioned between a headend associated with a cable provider and a plurality of downstream users, typically in a cascaded structure as described above.

Outdoor tap 10 as used in cascaded networks comprises a directional coupler 12 made from a ferrite core in the line 14 from in 16 to out 18, bypassed by a power choke 22 and capacitors 24, 26. The coupled port 30, also known as tap port, of ferrite core directional coupler 12 is connected typically to an input port 32 of a splitter 34 with the output ports 36, 38, 40, 42 of splitter 34 connected to output ports or connectors 44, 46, 48, 50 of outdoor tap 10. Splitter 34 can be of different architecture, for example, two way, three way, four way, six way or eight way depending on the needed number of user output ports on the outdoor tap.

Power choke 22 is required as these networks are powered using AC current of up to 10 Amp at 50 or 60 Hz passed along the coaxial cable and ferrite directional coupler 12 is not capable of carrying any significant AC or DC current. Power choke 22 is a large inductor and bridges the RF components in taps (and also in amplifiers). The power choke needs to be wideband as most cable networks use a frequency range of 5 MHz up to 1 GHz, needs to be capable of bypassing currents that can be as large as 10 Amps and also needs to have a low hum modulation at this current.

With the need to go to higher frequencies such as 5 MHz to 1200 MHz, or even up to 1700 MHz, the design of the power chokes becomes more critical as the power choke itself becomes the limiting factor in the RF performance of the tap. Typically, power chokes introduce ripple in the frequency response at specific frequencies, insertion loss at higher frequencies and reduce the return loss.

Figure 2:
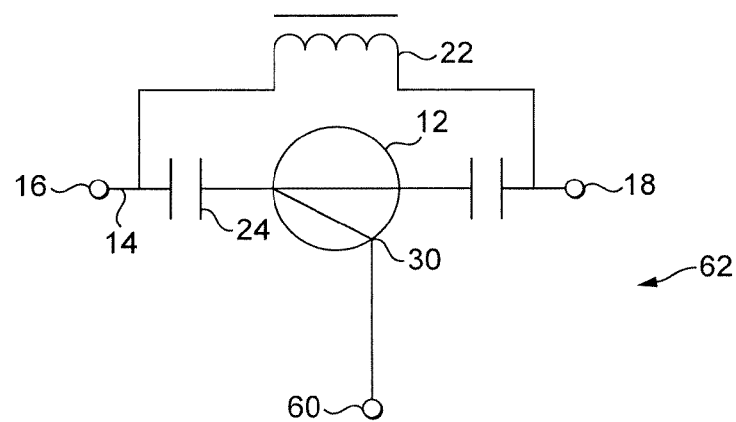
FIG. 2 shows a schematic diagram of a prior art directional coupler.

As shown in FIG. 2, sometimes only one output 60 is needed and in the industry such an outdoor tap 62 is known as a directional coupler.

The ferrite core directional coupler has several inherent limitations:

It is not capable of carrying any significant AC or DC current and so a bypassing power choke is required in the outdoor tap. As described, this power choke is a limiting factor.

It is susceptible to DC or AC pulses as this changes the magnetic parameters of the ferrite and then the directional coupler will generate so called PIM products (Passive Inter-Modulation) with the RF levels typically found in cable networks.

A ferrite core directional coupler has significant added insertion loss compared to the theoretical value.

The ferrite core directional coupler needs to be aligned in the practical world to get the best performance.

It is difficult to get a good wideband RF performance as needed when cable networks migrate to, for example, 5 MHz to 1200 MHz, or even 5 MHz to 1700 MHz.

In the practical world, the ferrite core directional coupler has a limit in the coupled value it can achieve. More than −16 dB coupled value is not possible to produce in the real world. This means that when an outdoor tap with a higher tap loss is needed this is achieved by adding an attenuator in the line from coupled port to the splitter or, in the event of a directional coupler, in the line to the output connector. The insertion loss from input to output of the outdoor tap however is still the same as a 16 dB ferrite core directional coupler.

The ferrite core directional coupler has a flat frequency response. This means that the tap loss, and also the insertion loss, is the same for all frequencies. However, the loss in the coaxial cable changes with the frequency; it is very low at low frequencies and quite high at high frequencies. Since the network is built with outdoor taps with different tap losses and the coaxial cable loss is very low at low frequencies, the actual loss in the complete network at low frequencies differs largely and depends on the tap output port.

This means that in the event of return path, the ingress (or noise) signals coming from the in-home installations are of equally different level. This is known in the industry as return path unbalance and it is very problematic as some in-home networks will limit the wanted received signals from other in-home installations. The ingress (or noise) level of the in-home installation connected to a low tap loss outdoor tap will be of much higher level and therefore dominant when added to wanted signals coming from an loss in-home installation connected to a high tap loss outdoor tap.

Figure 3:
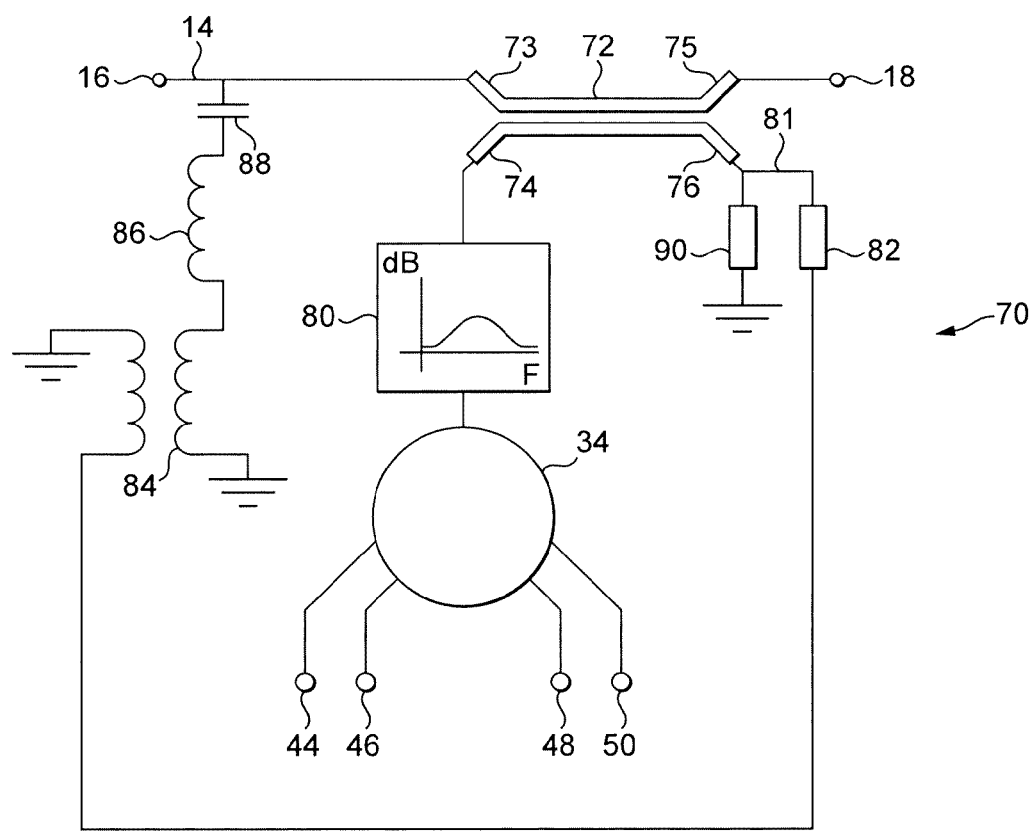
FIG. 3 shows a schematic diagram of an outdoor tap in accordance with the present invention.

To address the limitations of the ferrite core directional coupler, an embodiment of cable tap 70 in accordance with the present invention is shown in FIG. 3.

Outdoor tap 70 comprises a microstrip directional coupler 72 connected into path 14 passing from input 16 to output 18, with the microstrip directional coupler having an input port 73, an output port 75, coupled port 74 and an isolated port 76. Coupled port 74 of microstrip directional coupler 72 is in two-way communication with four-way splitter 34 to supply signals to, and receive signals from, tap connector or output ports 44, 46, 48 and 50. Disposed between coupled port 74 and splitter 34 is tilt compensating circuitry 80 to precisely adapt the tap loss to counteract coaxial cable losses. This circuitry actively modifies the tap loss as coaxial losses alter with frequency changes.

Isolated port 76 is connected to path 14 by way of a feedback path 81 incorporating resistor 82 connected to 180 degree transformer 84, with inductor 86 and capacitor 88 disposed between transformer 84 and path 14. This feedback path ensures the frequency response of the cable tap can be controlled at low frequencies. Capacitor 88 ensures that AC or DC voltage cannot migrate into the outdoor tap ports but instead flows through the upper strip of microstrip directional coupler 72. Resistor 90 in combination with resistor 82 acts as the isolation resistor of microstrip directional coupler 72.

There are many advantages of the proposed architecture of this tilted hybrid tap when compared to an outdoor tap with a ferrite core directional coupler.

When constructed on a material with low dielectric constant, the widths of the lines in the microstrip directional coupler become so large that the coupler itself is capable of transporting very high AC or DC current from input to output. Therefore, the power choke is not needed and all the inherent problems of hum modulation, added insertion loss, added ripple and reduced return loss are avoided. A typical dielectric material could be air.

The microstrip directional coupler is not susceptible to AC or DC pulses, as it has no ferrite core, and has no Passive Intermodulation when used with the RF levels typically found in cable networks.

It has a very low insertion loss from input to output when compared to a ferrite core directional coupler.

It can be easily produced in higher coupled values and thus an outdoor tap constructed to the proposed architecture has an even lower insertion loss from input to output on the higher tap loss models.

There is no need to align as the coupled loss is defined by the lengths, widths and gap between the lines. These values can all be accurately fixed in production, hence there is a cost reduction.

In the proposed architecture a wideband response, for example, 5 MHz top 1200 MHz or 5 MHz to 1700 MHz, is much easier to achieve when compared to a ferrite core directional coupler.

In the proposed outdoor tap architecture, the tap loss at the return path is the same for all models. Return path unbalance is no longer an issue. This results in much higher upstream data speeds.

The frequency response is not flat but tilted in such a way (high at low frequencies and low at high frequencies) that it counteracts the cable loss resulting in a flat response at the input of the in-home installation. Network alignment at the amplifier is much easier.

While the present invention has been illustrated by description of various embodiments and while those embodiments have been described in considerable detail, it is not the intention of Applicant to restrict or in any way limit the scope of the appended claims to such details. Additional advantages and modifications will readily appear to those skilled in the art. The present invention in its broader aspects is therefore not limited to the specific details and illustrative examples shown and described. Accordingly, departures may be made from such details without departing from the spirit or scope of Applicant's invention.

What is claimed is:

1. A cable tap device comprising a microstrip directional coupler disposed on an electrical path between an input and an output, the microstrip directional coupler arranged to communicate with a splitter device associated with a plurality of tap ports, wherein a feedback path comprising a transformer, resistive, inductive and capacitive elements connects an isolated port of the microstrip directional coupler to that part of the electrical path between the input and the input port of the microstrip directional coupler.

2. A cable tap device according to claim 1, wherein a coupling port of the microstrip directional coupler is in communication with the splitter device.

3. A cable tap device according to claim 1, wherein a tilt compensator is disposed between the microstrip directional coupler and the splitter device.

4. A cable tap device according to claim 1, wherein the inductive elements comprise a transformer connected to an inductor.

5. A cable tap device according to claim 4, wherein within the feedback path are disposed at least one resistive element between the isolated port and the transformer, with at least one inductive element and at least one capacitive element disposed between the transformer and that part of the electrical path running between the input and input port of the microstrip directional coupler.

6. A cable tap device according to claim 4, wherein the transformer is a 180 degree transformer.

* * * * *